United States Patent
Li et al.

(10) Patent No.: US 10,673,014 B2
(45) Date of Patent: Jun. 2, 2020

(54) ENCAPSULATION STRUCTURE, DISPLAY PANEL, ELECTRONIC DEVICE AND ENCAPSULATION METHOD

(71) Applicants: ORDOS YUANSHENG OPTOELECTRONICS CO., LTD., Ordos, Inner Mongolia (CN); BOE TECHNOLOGY GROUP CO., LTD., Beijing (CN)

(72) Inventors: Zihua Li, Beijing (CN); Zhibo Wen, Beijing (CN); Qiang Guo, Beijing (CN); Wenqiang Jin, Beijing (CN); Yu Yuan, Beijing (CN); Xudong Wang, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/555,112

(22) Filed: Aug. 29, 2019

(65) Prior Publication Data
US 2020/0111991 A1    Apr. 9, 2020

(30) Foreign Application Priority Data
Oct. 8, 2018 (CN) ................ 2018 1 1168204

(51) Int. Cl.
*H01L 51/52* (2006.01)
*H01L 51/56* (2006.01)
*H01L 27/32* (2006.01)

(52) U.S. Cl.
CPC ...... *H01L 51/5246* (2013.01); *H01L 27/3244* (2013.01); *H01L 51/56* (2013.01)

(58) Field of Classification Search
CPC .. H01L 51/5246; H01L 27/3244; H01L 51/56
See application file for complete search history.

(56) References Cited

U.S. PATENT DOCUMENTS

| | | | | |
|---|---|---|---|---|
| 2011/0121356 A1* | 5/2011 | Krawinkel | ........... | C09J 153/005 257/100 |
| 2013/0234298 A1* | 9/2013 | Mitsugi | ........... | B23K 26/18 257/629 |

* cited by examiner

*Primary Examiner* — Karen Kusumakar
(74) *Attorney, Agent, or Firm* — Leason Ellis LLP

(57) ABSTRACT

An encapsulation structure, a display panel, an electronic device and an encapsulation method are provided. The encapsulation structure includes: a first substrate and a second substrate, and a first sealant and a second sealant bonding the first substrate and the second substrate to each other. The first sealant includes a first inclined surface; the second sealant includes a second inclined surface which is attached to and in direct contact with the first inclined surface. In a direction parallel to the first substrate, each of the first inclined surface and the second inclined surface extends from a first position to a second position. Along a direction from the first position to the second position, a distance from the first inclined surface to the first substrate and a distance from the second inclined surface to the second substrate gradually change; and sums of the two distances are substantially equal.

20 Claims, 6 Drawing Sheets

ENCAPSULATION STRUCTURE, DISPLAY PANEL, ELECTRONIC DEVICE AND ENCAPSULATION METHOD

The application claims priority to the Chinese patent application No. 201811168204.0, filed on Oct. 8, 2018, the entire disclosure of which is incorporated herein by reference as part of the present application.

TECHNICAL FIELD

At least one embodiment of the present disclosure relates to an encapsulation structure, a display panel, an electronic device and an encapsulation method.

BACKGROUND

Some electronic devices (for example, OLED devices) have a poor ability to resist water vapor and oxygen. If being exposed to water vapor or oxygen, service lives of these electronic devices are reduced. As for encapsulations of electronic devices, current encapsulation technologies include a technology utilizing a sealant and an encapsulation cover plate, a film encapsulation technology and the like. Achieving a good encapsulation effect is of great significance for improving the service lives of the electronic devices.

SUMMARY

At least one embodiment of the present disclosure provides an encapsulation structure. The encapsulation structure comprises: a first substrate; a second substrate facing the first substrate; and a first sealant and a second sealant which are between the first substrate and the second substrate and bond the first substrate and the second substrate to each other. The first sealant comprises a first inclined surface facing away from the first substrate; the second sealant comprises a second inclined surface facing away from the second substrate, and the second inclined surface is attached to and in contact with the first inclined surface; in a direction parallel to the first substrate and the second substrate, each of the first inclined surface and the second inclined surface extends from a first position to a second position; along a direction from the first position to the second position, a distance from the first inclined surface to the first substrate gradually changes, and a distance from the second inclined surface to the second substrate gradually changes; and within a range from the first position to the second position, sums of the distance from the first inclined surface to the first substrate and the distance from the second inclined surface to the second substrate are substantially equal.

For example, along the direction from the first position to the second position, the distance from the first inclined surface to the first substrate gradually decreases, and the distance from the second inclined surface to the second substrate gradually increases.

For example, along the direction from the first position to the second position, the distance from the first inclined surface to the first substrate gradually increases, and the distance from the second inclined surface to the second substrate gradually decreases.

For example, a first included angle is between the first inclined surface and a plane in which the first substrate is located, and a second included angle is between the second inclined surface and a plane in which the second substrate is located; and the first included angle is equal to the second included angle.

For example, an orthographic projection of the first inclined surface on the first substrate substantially overlaps an orthographic projection of the second inclined surface on the first substrate, and an orthographic projection of the first inclined surface on the second substrate substantially overlaps an orthographic projection of the second inclined surface on the second substrate.

For example, the encapsulation structure comprises a plurality of first sealants and a plurality of second sealants, and the plurality of first sealants correspond to the plurality of second sealant in a one-to-one manner.

For example, the plurality of first sealants are connected into a closed ring, and the plurality of second sealants are connected into a closed ring.

For example, the encapsulation structure comprises four first sealants and four second sealants, the four first sealants correspond to the four second sealants in the one-to-one manner, the four first sealants are connected into a closed ring, and the four second sealants are connected into a closed ring.

For example, the direction from the first position to the second position is a length direction of the first sealant and a length direction of the second sealant.

For example, each of a material of the first sealant and a material of the second sealant comprises an ultraviolet curable resin or a heat curable resin.

At least one embodiment of the disclosure provides a display panel, and the display panel comprises the encapsulation structure as described above. The display panel comprises a display region and a peripheral region surrounding the display region, and the encapsulation structure is located in the peripheral region.

For example, the display region is of a rectangular shape; the encapsulation structure comprises four first sealants and four second sealants, the four first sealants correspond to the four second sealants in the one-to-one manner, the four first sealants are connected into a closed rectangular ring, and the four second sealants are connected into a closed rectangular ring At least one embodiment of the disclosure provides an electronic device, and the electronic device comprises the encapsulation structure as described above.

At least one embodiment of the disclosure provides an encapsulation method. The method comprises: providing a first substrate and a second substrate; forming a first sealant and a second sealant between the first substrate and the second substrate, in which the first sealant comprises a first inclined surface facing away from the first substrate, and the second sealant comprises a second inclined surface facing away from the second substrate; and bonding the first substrate and the second substrate to each other by the first sealant and the second sealant, in which the second inclined surface is attached to and in contact with the first inclined surface. In a direction parallel to the first substrate and the second substrate, each of the first inclined surface and the second inclined surface extends from a first position to a second position; along a direction from the first position to the second position, a distance from the first inclined surface to the first substrate gradually changes, and a distance from the second inclined surface to the second substrate gradually changes; and within a range from the first position to the second position, sums of the distance from the first inclined surface to the first substrate and the distance from the second inclined surface to the second substrate are substantially equal.

For example, the encapsulation method comprises: forming the first sealant on the first substrate, and forming the second sealant on the second substrate. The first sealant is coated on the first substrate along a first direction, and the second sealant is coated on the second substrate along a second direction opposite to the first direction.

For example, the encapsulation method comprises: coating the first sealant on the first substrate along the direction from the first position to the second position, in which the distance from the first inclined surface to the first substrate gradually decreases along the direction from the first position to the second position; and coating the second sealant on the second substrate along a direction from the second position to the first position, in which the distance from the second inclined surface to the second substrate gradually increases along the direction from the first position to the second position.

For example, the encapsulation method comprises: coating the first sealant on the first substrate along a direction from the second position to the first position, in which the distance from the first inclined surface to the first substrate gradually increases along the direction from the first position to the second position; and coating the second sealant on the second substrate along the direction from the first position to the second position, in which the distance from the second inclined surface to the second substrate gradually decreases along the direction from the first position to the second position.

For example, before bonding the first substrate and the second substrate to each other, the encapsulation method further comprises: incompletely curing the first sealant and the second sealant so that the first sealant and the second sealant do not flow.

For example, after bonding the first substrate and the second substrate to each other, the encapsulation method further comprises: completely curing the first sealant and the second sealant.

For example, the direction from the first position to the second position is a length direction of the first sealant and a length direction of the second sealant.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the protection scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Inside," "outside," "on," "under," and the like are only used to indicate relative position relationship, and when the position of the object which is described is changed, the relative position relationship may be changed accordingly.

The figures in embodiments of the present disclosure are not drawn according to actual proportions or scales. Specific sizes of structures in the figures may be determined according to actual requirements, and the figures of the embodiments of the present disclosure are only schematic views.

Currently, in a process of sealing an electronic device using an encapsulation cover plate and a sealant, the sealant is coated only along one single direction on a substrate (for example, a base substrate provided with an electronic element) or on the encapsulation cover plate. For example, taking a case where the sealant is coated on the base substrate provided with the electronic element as an example, due to a coating process itself, a height of the sealant in a direction perpendicular to the base substrate gradually decreases along a coating direction (a direction along which the sealant is coated). In this case, a gap occurs between the sealant and the encapsulation cover plate, thus the encapsulation structure is prone to having defects such as air leakage, etc.; or, the encapsulation cover plate placed on the sealant inclines and the encapsulation cover plate is not parallel to the base substrate, thus performances of the encapsulation structure are affected.

Figure 1:
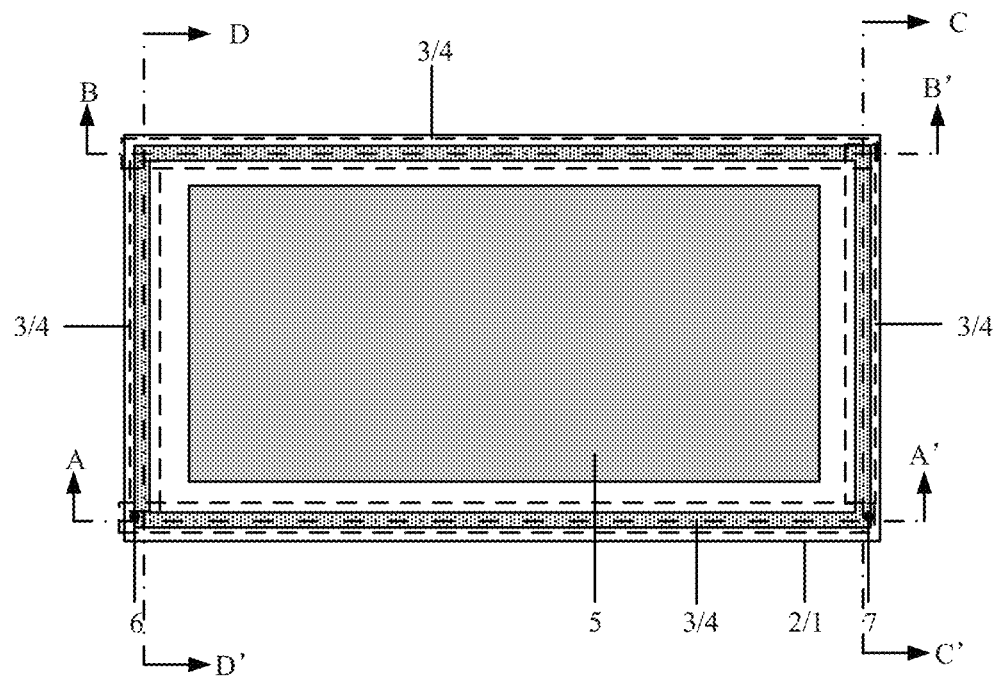
FIG. 1 is a plane schematic diagram of an encapsulation structure provided by at least one embodiment of the present disclosure.
Figure 2A:
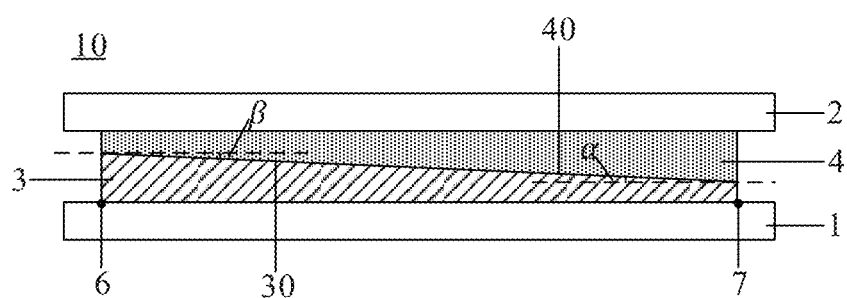
FIG. 2A is a cross-sectional schematic diagram taken along a line A-A' illustrated in FIG. 1.

FIG. 1 is a plane schematic diagram of an encapsulation structure provided by at least one embodiment of the present disclosure, and FIG. 2A is a cross-sectional schematic diagram taken along a line A-A' illustrated in FIG. 1. As illustrated in FIG. 1 and FIG. 2A, the encapsulation structure 10 seals an electronic element 5. The encapsulation structure 10 includes a first substrate 1, a second substrate 2, a first sealant 3 and a second sealant 4. The electronic element 5 is between the first substrate 1 and the second substrate 2, and the first sealant 3 and the second sealant 4 are disposed on an outer side of the electronic element 5 (i.e., the first sealant 3 and the second sealant 4 are disposed on a side, which is close to an edge of the first substrate 1 and an edge of the second substrate 2, of the electronic element 5) and are disposed to surround the electronic element 5 and seal the electronic element 5. As illustrated in FIG. 2A, the second substrate 2 faces the first substrate 1; the first sealant 3 and the second sealant 4 are disposed between the first substrate 1 and the second substrate 2 to bond the first substrate 1 and the second substrate 2 to each other. The first sealant 3 includes a first inclined surface 30 facing away from the first substrate 1, the second sealant 4 includes a second inclined surface 40 facing away from the second substrate 2, and the second inclined surface 40 is attached to and in contact with the first inclined surface 30. For example, the first substrate 1 is parallel to the second substrate 2. For example, in a direction parallel to the first substrate 1 and the second substrate 2, each of the first inclined surface 30 and the second inclined surface 40 extends from a first position 6 to a second position 7. For example, two ends of the first inclined surface 30 respectively overlap two ends of the second inclined surface 40 in a direction perpendicular to the first substrate 1 and the second substrate 2. Along a direction from the first position 6 to the second position 7, a distance from the first inclined surface 30 to the first substrate 1 gradually changes, and a distance from the second inclined surface 40 to the second substrate 2 gradually changes. Within a range from the first position 6 to the second position 7, sums of the distance $h_1$ from the first inclined surface 30 to the first substrate 1 and the distance $h_2$ from the second inclined surface 40 to the second substrate 2 are substantially equal. That is, in the direction perpendicular to the first substrate 1 and the second substrate 2, sums of a thicknesses of the first sealant 3 and a thicknesses of the second sealant 4 are substantially equal, so that a sealant layer composed of the first sealant 3 and the second sealant 4 has a uniform thickness within the range from the first position 6 to the second position 7, a gap occurred between the sealant layer and the first substrate or the second substrate due to a non-uniform thickness of the sealant layer is prevented, a sealing effect is improved, and thus external moisture, oxygen and the like are prevented from entering an inner sided of the encapsulation structure through the gap to contact the electronic element 5 and a service life of the electronic element 5 is prolonged. Meanwhile, it is prevented that the first substrate 1 and the second substrate 2 are not parallel to each other due to the non-uniform thickness of the sealant layer, that is, the second substrate 2 of the encapsulation structure 10 is prevented from tilting relative to the first substrate 1, and thus it is prevented that the tilting of the second substrate 2 affects the performances of the encapsulation structure 10 and performances of an electronic device (for example, an display device) adopting the encapsulation structure 10.

It should be noted that in a manufacturing process of forming the first inclined surface 30 and the second inclined surface 40, because of inevitable process errors (for example, process errors of $h_1$ and $h_2$ are within ±3%), a case where the sums of the distance $h_1$ from the first inclined surface 30 to the first substrate 1 and the distance $h_2$ from the second inclined surface 40 to the second substrate 2 are not completely equal within the range from the first position 6 to the second position 7 is also included in the protection scope of the present disclosure.

For example, each of a material of the first sealant 3 and a material of the second sealant 4 comprises an ultraviolet curable resin, for example, a free radical ultraviolet curable resin (such as epoxy acrylic resin, urethane acrylic resin, polyester acrylic resin, etc.), or a cationic photocurable resin (such as epoxy resin, vinyl ether resin, etc.). For example, each of the material of the first sealant 3 and the material of the second sealant 4 comprises a heat curable encapsulation adhesive, such as silicone of addition type. Of course, the material of the first sealant 3 and the material of the second sealant 4 are not limited to the types listed above. For example, the material of the first sealant 3 is same as the material of the second sealant 4. For example, the material of the first sealant 3 is different from the material of the second sealant 4.

For example, the electronic element 5 in at least one embodiment of the present disclosure includes one or a plurality of electroluminescent elements, and the electroluminescent element for example is an organic light emitting diode element or an inorganic light emitting element. For example, the electronic element 5 includes one or a plurality of organic light emitting diode elements. For example, the plurality of organic light emitting diode elements are arranged in an array to form a planar structure, and thus are applied to a device requiring full-surface light emission. Each of the organic light emitting diode elements includes, for example, an anode, a cathode and an organic light emitting layer sandwiched between the anode and the cathode; during the organic light emitting diode element is in operation, electrons are injected from the cathode, holes are injected from the anode, and a recombination of the electrons and the holes occurs in the light emitting layer so that the light emitting layer emits light. According to requirements, a hole injection layer and a hole transport layer are successively arranged from the anode to the organic light emitting layer, and an electron injection layer and an electron transport layer are successively arranged from the cathode to the organic light emitting layer. For example, the anode is made of a conductive material with a high work function, such as indium tin oxide (ITO), etc.; the cathode is made of a conductive material with a low work function, for example a metal with the low work function (such as Ag, Al, Ca, In, Li, Mg and the like), or a composite metal with the low work function (such as Mg—Ag composite metals), etc. For example, the organic light emitting diode element emits red light, green light, blue light, white light, etc. For example, in order to assist in adjusting colors of light, a structure such as a fluorescent layer or a color filter layer is provided on a light emitting side of the organic light emitting diode element.

In the encapsulation structure 10 provided by at least one embodiment of the present disclosure, for example, the first substrate 1 is a base substrate and the second substrate 2 is an encapsulation cover plate. For example, the base substrate includes the electronic element 5 and a driving circuit for driving the electronic element 5, and the driving circuit includes, for example, gate lines, data lines, switching transistors, driving transistors, storage capacitors, power lines, etc. For example, each of a material of the first substrate 1 and a material of the second substrate 2 comprises quartz, glass, plastic, or the like. Of course, types and materials of the first substrate 1 and the second substrate 2 are not limited to those listed above, and no limitation is imposed to this in the embodiments of the present disclosure.

For example, in at least one embodiment of the present disclosure, as illustrated in FIG. 2A, along the direction from the first position 6 to the second position 7, the distance $h_1$ from the first inclined surface 30 to the first substrate 1 gradually decreases, and the distance $h_2$ from the second inclined surface 40 to the second substrate 2 gradually increases, so that the sums of $h_1$ and $h_2$ are substantially equal at any position within the range from the first position 6 to the second position 7, that is, the sum of $h_1$ and $h_2$ at any position substantially remains unchanged within the range from the first position 6 to the second position 7, and thus the above technical effects are achieved.

For example, a first included angle α is between the first inclined plane 30 and a plane in which the first substrate 1 is located, and a second included angle β is between the second inclined surface 40 and a plane in which the second substrate 2 is located; the first included angle α is equal to the second included angle β so as to ensure that the first substrate 1 and the second substrate 2 are parallel to each other, so that the defects caused by inclination of the second substrate 2 or the first substrate 1 are avoided.

For example, an orthographic projection of the first inclined surface 30 on the first substrate 1 substantially overlaps an orthographic projection of the second inclined surface 40 on the first substrate 1, and an orthographic projection of the first inclined surface 30 on the second substrate 2 substantially overlaps an orthographic projection of the second inclined surface 40 on the second substrate 2. In this way, the first inclined surface 30 and the second inclined surface 40 completely overlap each other in the direction perpendicular to the first substrate 1 and the second substrate 2, so that the thickness of the first sealant 3 in the direction perpendicular to the first substrate 1 and the thickness of the second sealant 4 in the direction perpendicular to the first substrate 1 are complementary to each other at any position to obtain a better sealing effect and ensure that the first substrate 1 is parallel to the second substrate 2.

It should be noted that, in an alignment process that the first inclined surface 30 and the second inclined surface 40 are attached with each other, a case where the orthographic projection of the first inclined surface 30 on the first substrate 1 and the orthographic projection of the second inclined surface 40 on the first substrate 1 are not completely overlap each other because of inevitable process errors (for example, an alignment error is within ±3%) is also included in the protection scope of the present disclosure, and a case where the orthographic projection of the first inclined surface 30 on the second substrate 2 and the orthographic projection of the second inclined surface 40 on the second substrate 2 are not completely overlap each other because of inevitable process errors (for example, an alignment error is within ±3%) is also included in the protection scope of the present disclosure.

For example, as illustrated in FIG. 1, the encapsulation structure 10 includes a plurality of first sealants 3, and each of the plurality of first sealants 3 includes the first inclined surface 30; correspondingly, the encapsulation structure 10 includes a plurality of second sealants 4, and each of the plurality of second sealants 4 includes the second inclined surface 40. The plurality of second sealants 4 correspond to the plurality of first sealants 3 in a one-to-one manner. That is, the cross-sectional views respectively taken along the B-B' line, the C-C' line, and the D-D' line in FIG. 1 are also as shown in FIG. 2A. In this way, the thicknesses of the first sealant 1 and the thickness of the second sealant 2 are complementary to each other at any position around the electronic element 5 so that the sealant layer (composed of the first sealant 3 and the second sealant 4) has equal thicknesses at any position around the electronic element 5, which avoids the gap occurred between the sealant layer (composed of the first sealant 3 and the second sealant 4) and the first substrate 1 or the second substrate 2 at any position around the electronic element 5 and achieves the better sealing effect.

For example, the plurality of first sealants 3 are connected into a closed ring, and the plurality of second sealants 4 are connected into a closed ring, so that the plurality of first sealants 3 and the plurality of second sealants 4 form a closed ring surrounding the electronic element 5. Thus, the sealant layer (composed of the first sealant 3 and the second sealant 4) has equal thickness at any position around the electronic element 5 to avoid the gap occurred between the sealant layer and the first substrate 1 or the second substrate 2 and obtain the better sealing effect.

For example, as illustrated in FIG. 1, the encapsulation structure includes four first sealants 3 and four second sealants 4, and the four first sealants 3 correspond to the four second sealants 4 in a one-to-one manner. The four first sealants 3 are connected into a closed rectangular ring, and the four second sealants 4 are connected into a closed rectangular ring.

Figure 2B:
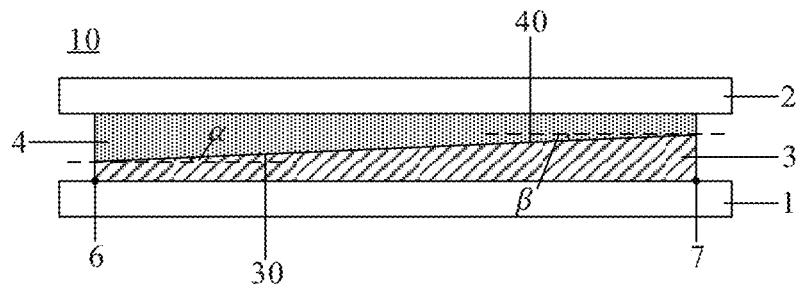
FIG. 2B is another cross-sectional schematic diagram taken along the line A-A' illustrated in FIG. 1.

For example, FIG. 2B is another cross-sectional schematic diagram taken along the line A-A' illustrated in FIG. 1. A difference between the structure illustrated in FIG. 2B and the structure illustrated in FIG. 2A is that: along the direction from the first position 6 to the second position 7 illustrated in FIG. 2B, the distance $h_1$ from the first inclined surface 30 to the first substrate 1 gradually increases and the distance $h_2$ from the second inclined surface 40 to the second substrate 2 gradually decreases, so that the sums of $h_1$ and $h_2$ are substantially equal at any position within the range from the direction from the first position 6 to the second position 7, and thus the above technical effects are achieved. Other features of the structure illustrated in FIG. 2B are the same as those illustrated in FIG. 2A and are not be repeated here, please refer to the previous descriptions.

For example, the direction from the first position 6 to the second position 7 is a length direction of the first sealant 3 and a length direction of the second sealant 4.

Figure 3A:
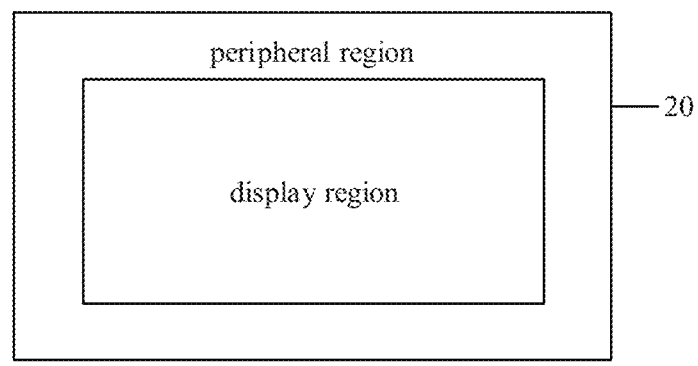
FIG. 3A is a schematic diagram of a display panel provided by at least one embodiment of the present disclosure.

At least one embodiment of the present disclosure further provides a display panel, and the display panel comprises any one encapsulation structure 10 provided by the embodiments of the present disclosure. FIG. 3A is a schematic diagram of the display panel provided by at least one embodiment of the present disclosure. For example, as illustrated in FIG. 3A, the display panel 20 comprises a display region and a peripheral region surrounding the display region, the electronic element 5 as described above is provided in the display region, and the encapsulation structure 10 provided by the embodiments of the disclosure is provided in the peripheral region. For example, the display region is of a rectangular shape; the encapsulation structure 10 comprises four first sealants 3 and four second sealants 4, the four first sealants 3 correspond to the four second sealants 4 in the one-to-one manner, the four first sealants 3 are connected into the closed rectangular ring, and the four second sealants 4 are connected into the closed rectangular ring.

Because the display panel 20 comprises any one encapsulation structure 10 provided by the embodiments of the present disclosure, the display panel 20 has a better sealing performance and a longer service life.

The encapsulation structure provided by at least one embodiment of the present disclosure is applied to, for example, a display device, a lighting device (for example, a lamp for lighting), etc.

At least one embodiment of the present disclosure further provides an electronic device including any one encapsulation structure 10 provided by the embodiments of the present disclosure.

Figure 3B:
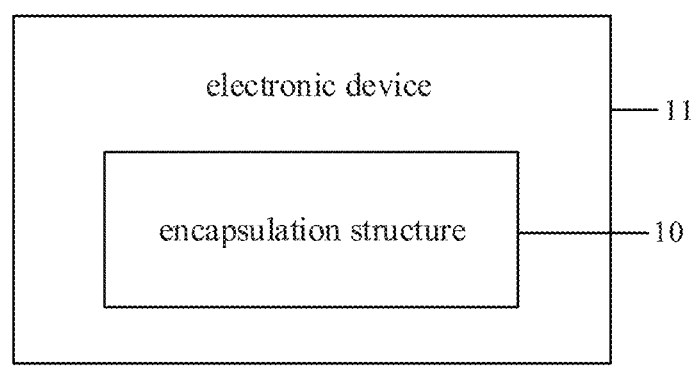
FIG. 3B is a schematic diagram of an electronic device provided by at least one embodiment of the present disclosure.

FIG. 3B is a schematic diagram of the electronic device provided by at least one embodiment of the present disclosure. For example, as illustrated in FIG. 3B, at least one embodiment of the present disclosure further provides the electronic device 11 including any one encapsulation structure 10 provided by the embodiments of the present disclosure. The electronic device 11 has a better sealing performance and a longer service life, and the first substrate and the second substrate of the electronic device are better parallel to each other, so that the electronic device has better performances, and defects (for example, display defects in a case where the electronic device 11 is a display device) caused by inclination of the first substrate or the second substrate are avoided.

For example, the electronic device 11 is the display device (for example, an OLED display device, an inorganic electroluminescence display device, etc.), for example, the electronic device 11 is a product or component having a display function such as a mobile phone, a tablet computer, a television, a display, a notebook computer, a digital camera, a navigator, etc. For example, the electronic device 11 is the lighting device (for example, an OLED lighting device, etc.), for example, a lighting lamp, a decorative colored lamp, etc. Of course, no limitation is imposed to the type of the electronic device in the embodiments of the present disclosure.

It should be noted that FIG. 3B is only a schematic diagram of the electronic device including any one encapsulation structure provided by the embodiments of the present disclosure, and other structures of the electronic device are not illustrated in the figures. Those skilled in the art may refer to conventional technologies of other structures of the electronic device, and no limitation is imposed in the embodiments of the present disclosure.

At least one embodiment of the present disclosure further provides an encapsulation method, and the method comprises: providing a first substrate and a second substrate; forming a first sealant and a second sealant between the first substrate and the second substrate, in which the first sealant comprises a first inclined surface facing away from the first substrate, and the second sealant comprises a second inclined surface facing away from the second substrate; and bonding the first substrate and the second substrate to each other by the first sealant and the second sealant, in which the second inclined surface is attached to and in contact with the first inclined surface. In a direction parallel to the first substrate and the second substrate, each of the first inclined surface and the second inclined surface extends from a first position to a second position; along a direction from the first position to the second position, a distance from the first inclined surface to the first substrate gradually changes, and a distance from the second inclined surface to the second substrate gradually changes; and within a range from the first position to the second position, sums of the distance from the first inclined surface to the first substrate and the distance from the second inclined surface to the second substrate are substantially equal.

For example, the encapsulation method comprises forming the first sealant formed on the first substrate and forming the second sealant on the second substrate. For example, the first sealant is coated on the first substrate along a first direction, and the second sealant is coated on the second substrate along a second direction opposite to the first direction.

Figure 4A:
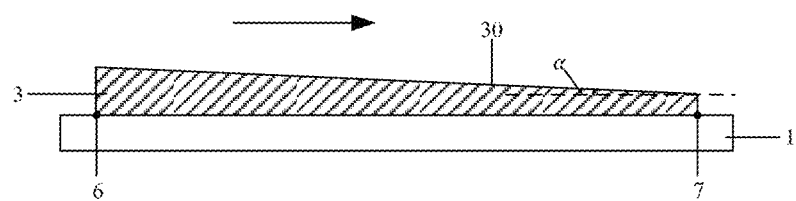
FIG. 4A-FIG. 4F are schematic diagrams of an encapsulation method provided by at least one embodiment of the present disclosure.
Figure 4B:
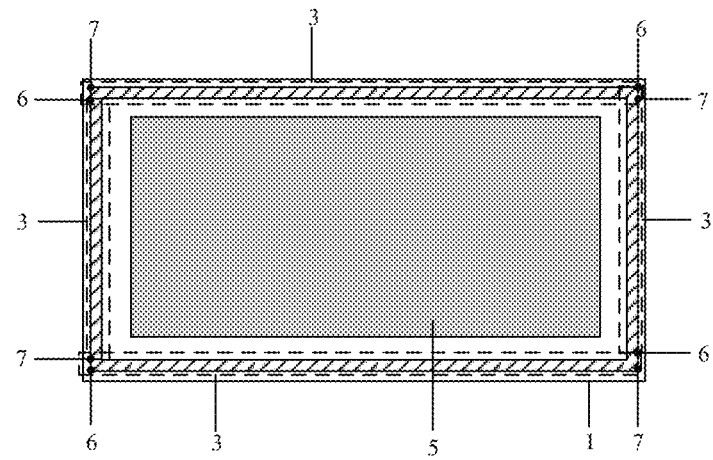
Figure 4C:
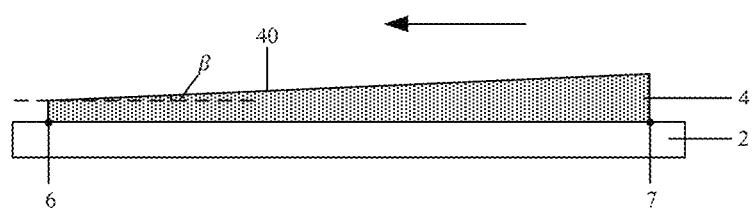
Figure 4D:
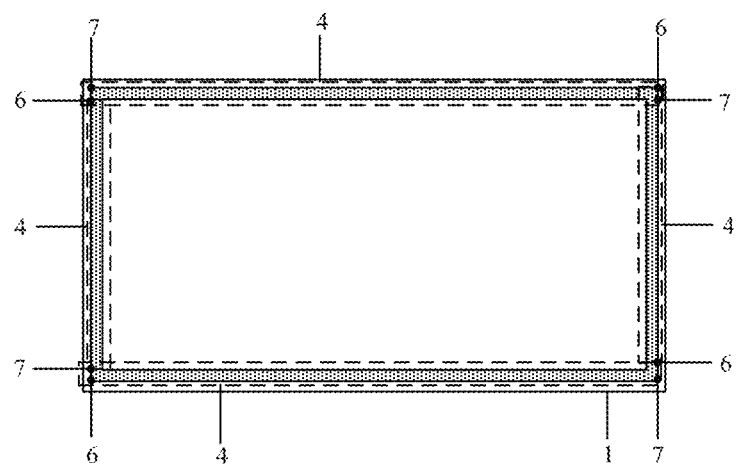

For example, FIG. 4A-FIG. 4F are schematic diagrams of the encapsulation method provided by at least one embodiment of the present disclosure, FIG. 4B is a plane view of the first substrate after forming the first sealant illustrated in FIG. 4A, and FIG. 4D is a plane view of the second substrate after forming the second sealant illustrated in FIG. 4C.

As illustrated in FIGS. 4A and 4B, a first substrate 1 is provided and an electronic element 5 is formed on the first substrate 1. For example, the electronic element 5 is formed by a semiconductor process. Those skilled in the art may form the electronic element 5 with reference to conventional techniques in the art. For example, the first sealant 3 is formed on an outer side (for example, a side, which is close to an edge of the first substrate 1, of the electronic element 5) of the electronic element 5 on the first substrate 1. For example, the first sealant 3 is formed by coating. For example, the first sealant 3 is coated on the first substrate 1 in a direction from a first position 6 to a second position 7 (for example, a direction illustrated by an arrow in FIG. 4A). For example, the first sealant 3 is coated by a coating device, and a scraper at a sealant outlet of the coating device moves in the direction from the first position 6 to the second position 7. The scraper passes a surface, which faces away from the first substrate 1, of the first sealant 3 as coating the first sealant 3, so that a thickness of the first sealant 3 in the direction perpendicular to the first substrate 1 gradually decreases along the movement direction of the scraper. Therefore, the first sealant 3 includes a first inclined surface 30 facing away from the first substrate 1, a distance $h_1$ (that is the thickness of the first sealant 3 in a direction perpendicular to the first substrate 1) from the first inclined surface 30 to the first substrate 1 gradually decreases along the direction from the first position 6 to the second position 7, and a first included angle α is between the first inclined plane 30 and a plane in which the first substrate 1 is located.

For example, as illustrated in FIG. 4B, a plurality of first sealants 3 are formed, and each of the plurality of first sealants 3 includes the first inclined surface 30. The plurality of first sealants are sequentially formed respectively by the above-mentioned method of forming the first sealant 3. For example, the plurality of first sealants 3 are sequentially formed counterclockwise. The above-mentioned first position and second position exist with respect to each of the plurality of first sealants 3. For example, during forming the first sealant 3 on a lower side of the first substrate 1, the first sealant 3 is formed by coating along the direction from the first position 6 to the second position 7 on the lower side of the first substrate 1; during forming the first sealant 1 on a right side of the first substrate 1, the first sealant 3 is formed by coating along the direction from the first position 6 to the second position 7 on the right side of the first substrate 1; during forming the first sealant 3 on an upper side of the first substrate 1, the first sealant 3 is formed by coating along the direction from the first position 6 to the second position 7 on the upper side of the first substrate 1; during forming the first sealant 3 on a left side of the first substrate 1, the first sealant 3 is formed by coating along the direction from the first position 6 to the second position 7 on the left side of the first substrate 1. For example, the plurality of first sealants 3 are connected into a closed ring which is provided on the outer side of the electronic element 5 and surrounds the electronic element 5.

As illustrated in FIG. 4C, a second substrate 2 is provided, and a second sealant 4 is formed on the second substrate 2 at a position corresponding to the first sealant 3, so that the first sealant 3 is attached to and in contact with the second sealant 4 after the first substrate 1 and the second substrate 2 are subsequently bonded. The second sealant 4 is coated on the second substrate 2 along a direction from the second position 7 to the first position 6 (for example, a direction illustrated by an arrow in FIG. 4C). After the first substrate 1 and the second substrate 2 are subsequently bonded, the first position 6 in FIG. 4C overlaps the first position 6 in FIG. 4A, and the second position 7 in FIG. 4C overlaps the second position 7 in FIG. 4A. For example, the second sealant 4 is coated by the coating device, and the scraper at the sealant outlet of the coating device moves in the direction from the second position 7 to the first position 6. The scraper passes a surface, which faces away from the second substrate 2, of the second sealant 4 as coating the second sealant 4, so that a thickness of the second sealant 4 in a direction perpendicular to the second substrate 2 gradually decreases along the movement direction of the scraper. Therefore, the second sealant 4 includes a second inclined surface 40 facing away from the second substrate 2, a distance $h_2$ (that is the thickness of the second sealant 4 in a direction perpendicular to the second substrate 2) from the second inclined surface 40 to the second substrate 2 gradually decreases along the direction from the second position 7 to the first position 6; that is, along the direction from the first position 6 to the second position 7, the distance $h_2$ from the second inclined surface 40 to the second substrate 2 gradually increases. A second included angle β is between the second inclined surface 40 and a plane in which the second substrate 2 is located. For example, the first included angle α is equal to the second included angle β. It should be noted that, a case where the first included angle α and the second included angle β are not completely equal because of inevitable process errors (for example, a manufacturing process error is within ±3%) is also included in the protection scope of the present disclosure.

For example, as illustrated in FIG. 4D, a plurality of second sealants 4 are formed, and each of the plurality of second sealants 4 includes the second inclined surface 40. The plurality of second sealants 4 are sequentially formed respectively by the above-mentioned method of forming the second sealant 4. For example, the plurality of second sealants 4 are sequentially formed clockwise. The above-mentioned first position and second position exist with respect to each of the plurality of second sealants 4. For example, during forming the second sealant 4 on a lower side of the second substrate 2, the second sealant 4 is formed by coating along the direction from the second position 7 to the first position 6 on the lower side of the second substrate 2; during forming the second sealant 4 on a left side of the second substrate 2, the second sealant 4 is formed by coating along the direction from the second position 7 to the first position 6 on the left side of the second substrate 2; during forming the second sealant 4 on an upper side of the second substrate 2, the second sealant 4 is formed by coating along the direction from the second position 7 to the first position 6 on the upper side of the second substrate 2; during forming the second sealant 4 on a right side of the second substrate 2, the second sealant 4 is formed by coating along the direction from the second position 7 to the first position 6 on the right side of the second substrate 2. For example, the plurality of second sealants 4 are connected into a closed ring corresponding to the closed ring formed by the plurality of first sealants 3 in FIG. 4B, so that the first sealants 3 respectively are attached to and in contact with the second sealants 4 after the first substrate 1 and the second substrate 2 are subsequently bonded to each other.

For example, before bonding the first substrate 1 and the second substrate 2 to each other, the encapsulation method further comprises: incompletely curing the first sealant 3 and the second sealant 4 so that the first sealant 3 and the second sealant 4 do not flow. That is, the first sealant 3 in FIG. 4A and the second sealant 4 in FIG. 4C are incompletely cured to prevent the first sealant 3 and the second sealant 4 from flowing, so as to prevent the first sealant 3 and the second sealant 4 from deforming in the subsequent process of bonding the first substrate 1 and the second substrate 2. The first sealant 3 and the second sealant 4 after being incompletely cured cannot flow, so shapes of the first sealant 3 and the second sealant 4 do not change; but unlike the sealant that is completely cured, the first sealant 3 and the second sealant 4 after being incompletely cured still have adhesive properties. The specific method for incompletely curing the sealant may be selected according to the materials of the first sealant 3 and the second sealant 4. For example, the material of the first sealant 3 and the material of the second sealant 4 are ultraviolet curable resins, the first sealant 3 and the second sealant 4 are incompletely cured by ultraviolet irradiation, and an intensity and illumination time of ultraviolet light are adjusted to realize incompletely curing of the first sealant 3 and the second sealant 4. For example, the material of the first sealant 3 and the material of the second sealant 4 are heat curable resins, the first sealant 3 and the second sealant 4 are incompletely cured by heating, and a heating temperature and a heating time are adjusted to realize the incomplete curing of the first sealant 3 and the second sealant 4. Some specific curing parameters such as the temperature and the time may be selected according to actual requirements.

Figure 4E:
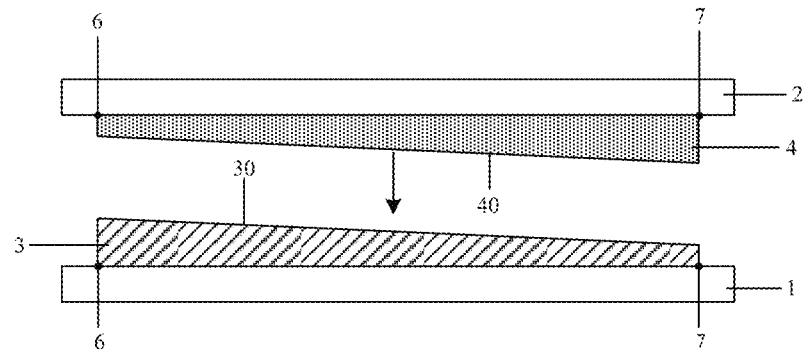
Figure 4F:
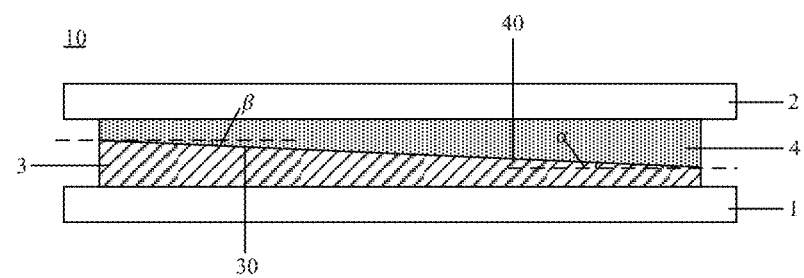

As illustrated in FIG. 4E, the first substrate 1 faces the second substrate 2 so that the first sealant 3 faces the second sealant 4, the first substrate 1 and the second substrate 2 are bonded to each other by using the first sealant 3 and the second sealant 4, and the second inclined surface 40 is attached to and in contact with the first inclined surface 30 so that the second inclined surface 40 is bonded to the first inclined surface 30, and thereby the encapsulation structure 10 illustrated in FIG. 4F is obtained. For example, the first inclined surface 30 of each of the plurality of first sealants 3 illustrated in FIG. 4B respectively is attached to and in contact with the second inclined surface 40 of each of the plurality of second sealants 4 illustrated in FIG. 4D; in the direction parallel to the first substrate 1 and the second substrate 2, each of the first inclined surface 30 and the second inclined surface 40 extends from the first position 6 to the second position 7. Within the range from the first position 6 to the second position 7, the sums of the distance $h_1$ from the first inclined surface 30 to the first substrate 1 and the distance $h_2$ from the second inclined surface 40 to the second substrate 2 are substantially equal, that is, the thickness of the first sealant 3 in the direction perpendicular to the first substrate 1 and the thickness of the second sealant 4 in the direction perpendicular to the first substrate 1 are complementary to each other so that the first substrate 1 is parallel to the second substrate 2, and thus it is prevented that the first substrate 1 and the second substrate 2 are not parallel to each other because of the non-uniform thickness of the sealant layer (composed of the first sealant 3 and the second sealant 4), that is, the second substrate 2 of the encapsulation structure 10 is prevented from tilting relative to the first substrate 1, and thus it is prevented that the tilting of the second substrate 2 affects the performances of the encapsulation structure 10 and performances of the electronic device (for example, the display device) adopting the encapsulation structure 10. Meanwhile, the sealant layer composed of the first sealant 3 and the second sealant 4 has a uniform thickness within the range from the first position 6 to the second position 7, the gap occurred between the sealant layer and the first substrate or the second substrate because of the non-uniform thickness of the sealant layer is prevented, the sealing effect is improved, and thus external moisture, oxygen and the like are prevented from entering the inner side of the encapsulation structure through the gap to contact the electronic element 5, so that the service life of the electronic element 5 is prolonged.

For example, after bonding the first substrate 1 and the second substrate 2 to each other, the encapsulation method further comprises: completely curing the first sealant 3 and the second sealant 4. For example, the material of the first sealant 3 and the material of the second sealant 4 are ultraviolet curable resins, the first sealant 3 and the second sealant 4 are completely cured by ultraviolet irradiation. For example, the material of the first sealant 3 and the material of the second sealant 4 are heat curable resins, the first sealant 3 and the second sealant 4 are completely cured by a method of heating.

For example, in the encapsulation structure 10 formed by the encapsulation method provided by at least one embodiment of the present disclosure, as illustrated in FIG. 4F, for example, the first included angle α is equal to the second included angle β so as to ensure that the first substrate 1 and the second substrate 2 are parallel to each other, and thus the defects caused by inclination of the second substrate 2 or the first substrate 1 are avoided.

For example, an orthographic projection of the first inclined surface 30 on the first substrate 1 substantially overlaps an orthographic projection of the second inclined surface 40 on the first substrate 1, and an orthographic projection of the first inclined surface 30 on the second substrate 2 substantially overlaps an orthographic projection of the second inclined surface 40 on the second substrate 2. In this way, the first inclined surface 30 and the second inclined surface 40 completely overlap each other in the direction perpendicular to the first substrate 1 and the second substrate 2, so that the thickness of the first sealant 3 in the direction perpendicular to the first substrate 1 and the thickness of the second sealant 4 in the direction perpendicular to the first substrate 1 are complementary to each other at any position to obtain a better sealing effect and ensure that the first substrate 1 is parallel to the second substrate 2.

In the above embodiments, the plurality of first sealant 3 are connected into the closed ring and the plurality of second sealants 4 are connected into the closed ring; after the first substrate 1 and the second substrate 2 are bonded to each other, the plurality of first sealants 3 and the plurality of second sealants 4 form a closed ring around the electronic element 5. In this way, the sealant layer composed of the first sealant 3 and the second sealant 4 has equal thicknesses at any position around the electronic element 5, and thus the gap occurred between the sealant layer and the first substrate 1 or the second substrate 2 is avoided and a better sealing effect is achieved.

Figure 5A:
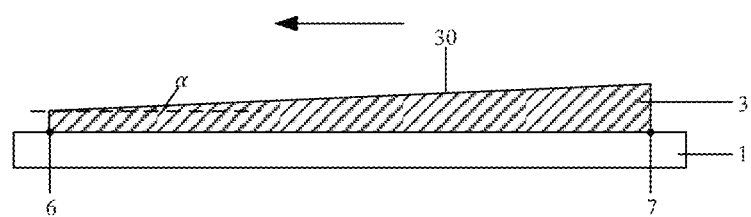
FIG. 5A-FIG. 5F are another schematic diagrams of the encapsulation method provided by at least one embodiment of the present disclosure.
Figure 5B:
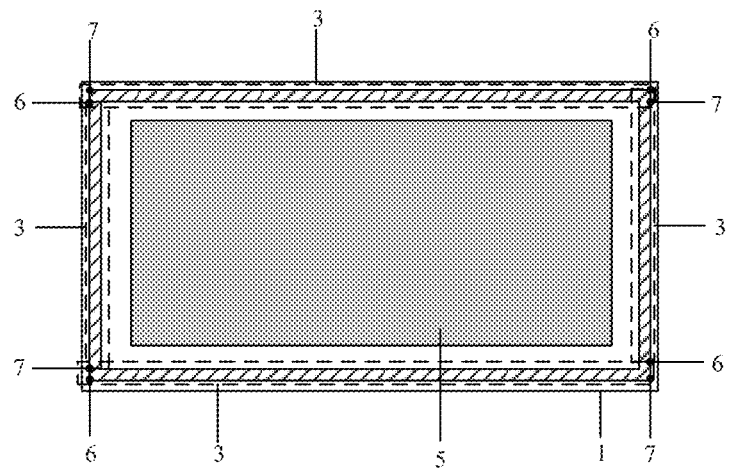
Figure 5C:
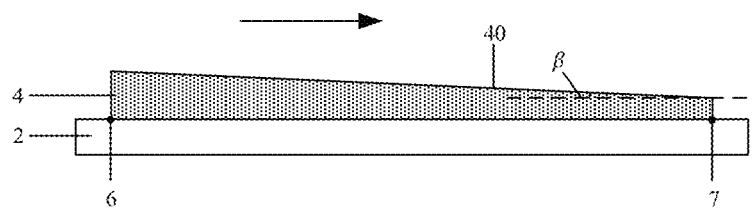
Figure 5D:
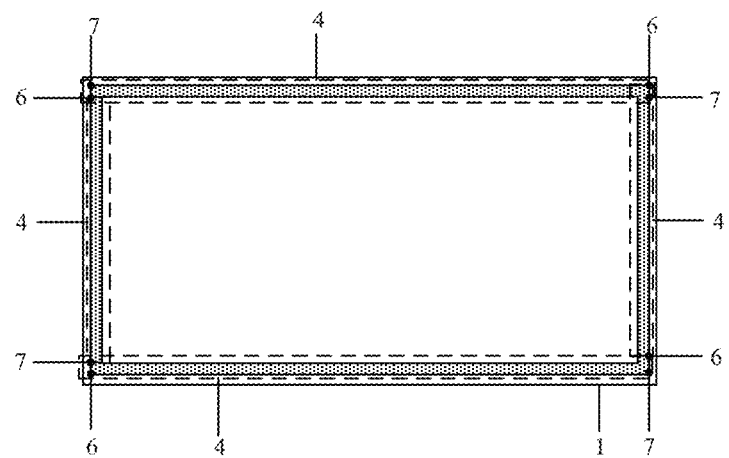

FIG. 5A-FIG. 5F are another schematic diagram of the encapsulation method provided by at least one embodiment of the present disclosure, FIG. 5B is a plane view of the first substrate after forming the first sealant illustrated in FIG. 5A, and FIG. 5D is a plane view of the second substrate after forming the second sealant illustrated in FIG. 5C.

As illustrated in FIG. 5A, the first substrate 1 is provided, and the electronic element 5 and the first sealant 3 are formed on the first substrate 1. The method of forming the first sealant 3 illustrated in FIG. 5A differs from the method illustrated in FIG. 4A in that the first sealant 3 is coated on the first substrate 1 in the direction from the second position 7 to the first position 6 (for example, a direction illustrated by an arrow in FIG. 5A). Therefore, the scraper at the sealant outlet of the coating device moves in the direction from the second position 7 to the first position 6. The scraper passes the surface, which faces away from the first substrate 1, of the first sealant 3 as coating the first sealant 3, so that the thickness of the first sealant 3 in the direction perpendicular to the first substrate 1 gradually decreases along the movement direction of the scraper. Therefore, the first sealant 3 includes the first inclined surface 30 facing away from the first substrate 1, the distance $h_1$ (that is the thickness of the first sealant 3 in the direction perpendicular to the first substrate 1) from the first inclined surface 30 to the first substrate 1 gradually increases along the direction from the first position 6 to the second position 7, and the first included angle α is between the first inclined plane 30 and the plane in which the first substrate 1 is located.

As illustrated in FIG. 5B, a plurality of first sealants 3 are formed, and each of the plurality of first sealants 3 includes the first inclined surface 30. The plurality of first sealants are sequentially formed respectively by the above-mentioned method of forming the first sealant 3. For example, the plurality of first sealants 3 are sequentially formed clockwise. The above-mentioned first position and second position exist with respect to each of the plurality of first sealants 3. For example, during forming the first sealant 3 on the lower side of the first substrate 1, the first sealant 3 is formed by coating along the direction from the second position 7 to the first position 6 on the lower side of the first substrate 1; during forming the first sealant 1 on the left side of the first substrate 1, the first sealant 3 is formed by coating along the direction from the second position 7 to the first position 6 on the left side of the first substrate 1; during forming the first sealant 3 on the upper side of the first substrate 1, the first sealant 3 is formed by coating along the direction from the second position 7 to the first position 6 on the upper side of the first substrate 1; during forming the first sealant 3 on the right side of the first substrate 1, the first sealant 3 is formed by coating along the direction from the second position 7 to the first position 6 on the right side of the first substrate 1. For example, the plurality of first sealants 3 are connected into the closed ring which is provided on the outer side of the electronic element 5 and surrounds the electronic element 5.

As illustrated in FIG. 5C, the second substrate 2 is provided, and the second sealant 4 is formed on the second substrate 2 at the position corresponding to the first sealant 3, so that the first sealant 3 is attached to and in contact with the second sealant 4 after the first substrate 1 and the second substrate 2 are subsequently bonded. The method of forming the second sealant 4 illustrated in FIG. 5C differs from the method illustrated in FIG. 4C in that the second sealant 4 is coated on the second substrate 2 along the direction from the first position 6 to the second position 7 (for example, a direction illustrated by an arrow in FIG. 5C). The scraper at the sealant outlet of the coating device moves in the direction from the first position 6 to the second position 7. The scraper passes the surface, which faces away from the second substrate 2, of the second sealant 4 as coating the second sealant 4, so that the thickness of the second sealant 4 in the direction perpendicular to the second substrate 2 gradually decreases along the movement direction of the scraper. Therefore, the second sealant 4 includes the second inclined surface 40 facing away from the second substrate 2, the distance $h_2$ (that is the thickness of the second sealant 4 in the direction perpendicular to the second substrate 2) from the second inclined surface 40 to the second substrate 2 gradually decreases. Thus the second included angle β is between the second inclined surface 40 and the plane in which the second substrate 2 is located. For example, the first included angle α is equal to the second included angle β.

As illustrated in FIG. 5D, a plurality of second sealants 4 are formed, and each of the plurality of second sealants 4 includes the second inclined surface 40. The plurality of second sealants 4 are sequentially formed respectively by the above-mentioned method of forming the second sealant 4. For example, the plurality of second sealants 4 are sequentially formed counterclockwise. The above-mentioned first position and second position exist with respect to each of the plurality of second sealants 4. For example, during forming the second sealant 4 on the lower side of the second substrate 2, the second sealant 4 is formed by coating along the direction from the first position 6 to the second position 7 on the lower side of the second substrate 2; during forming the second sealant 4 on the right side of the second substrate 2, the second sealant 4 is formed by coating along the direction from the first position 6 to the second position 7 on the right side of the second substrate 2; during forming the second sealant 4 on the upper side of the second substrate 2, the second sealant 4 is formed by coating along the direction from the first position 6 to the second position 7 on the upper side of the second substrate 2; during forming the second sealant 4 on the left side of the second substrate 2, the second sealant 4 is formed by coating along the direction f from the first position 6 to the second position 7 on the left side of the second substrate 2. For example, the plurality of second sealants 4 are connected into the closed ring corresponding to the closed ring formed by the plurality of first sealants 3 in FIG. 5B, so that the first sealants 3 respectively are attached to and in contact with the second sealants 4 after the first substrate 1 and the second substrate 2 are subsequently bonded to each other For example, before bonding the first substrate and the second substrate to each other, the encapsulation method further comprises: incompletely curing the first sealant and the second sealant so that the first sealant and the second sealant do not flow.

Figure 5E:
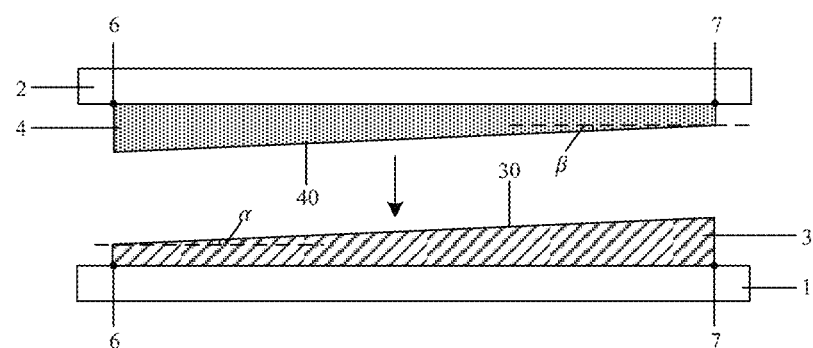
Figure 5F:
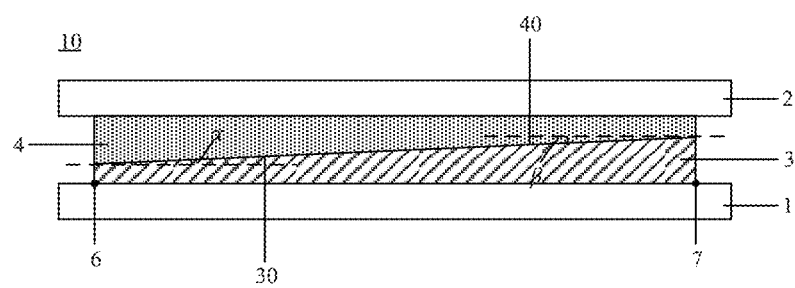

As illustrated in FIG. 5E, the first substrate 1 faces the second substrate 2 so that the first sealant 3 faces the second sealant 4, the first substrate 1 and the second substrate 2 are bonded to each other by using the first sealant 3 and the second sealant 4, and the second inclined surface 40 is attached to and in contact with the first inclined surface 30 so that the second inclined surface 40 is bonded to the first inclined surface 30, and thereby the encapsulation structure 10 illustrated in FIG. 5F is obtained. The technical effects of the encapsulation method illustrated in FIG. 5A-5F and other features not mentioned in the encapsulation structure 10 obtained by the method illustrated in FIG. 5A-5F are the same as those illustrated in FIG. 4A-4F, and are not repeated here. Please refer to the previous descriptions.

What have been described above are only specific implementations of the present disclosure, the protection scope of the present disclosure is not limited thereto. The protection scope of the present disclosure should be based on the protection scope of the claims.

What is claimed is:

1. An encapsulation structure, comprising:
   a first substrate;
   a second substrate facing the first substrate; and
   a first sealant and a second sealant which are between the first substrate and the second substrate and bond the first substrate and the second substrate to each other, wherein
   the first sealant comprises a first inclined surface facing away from the first substrate;
   the second sealant comprises a second inclined surface facing away from the second substrate, and the second inclined surface is attached to and in contact with the first inclined surface;
   in a direction parallel to the first substrate and the second substrate, each of the first inclined surface and the second inclined surface extends from a first position to a second position;
   along a direction from the first position to the second position, a distance from the first inclined surface to the first substrate gradually changes, and a distance from the second inclined surface to the second substrate gradually changes; and
   within a range from the first position to the second position, sums of the distance from the first inclined surface to the first substrate and the distance from the second inclined surface to the second substrate are substantially equal.

2. The encapsulation structure according to claim 1, wherein along the direction from the first position to the second position, the distance from the first inclined surface to the first substrate gradually decreases, and the distance from the second inclined surface to the second substrate gradually increases.

3. The encapsulation structure according to claim 1, wherein along the direction from the first position to the second position, the distance from the first inclined surface to the first substrate gradually increases, and the distance from the second inclined surface to the second substrate gradually decreases.

4. The encapsulation structure according to claim 1, wherein
   a first included angle is between the first inclined surface and a plane in which the first substrate is located, and a second included angle is between the second inclined surface and a plane in which the second substrate is located; and
   the first included angle is equal to the second included angle.

5. The encapsulation structure according to claim 1, wherein an orthographic projection of the first inclined surface on the first substrate substantially overlaps an orthographic projection of the second inclined surface on the first substrate, and an orthographic projection of the first inclined surface on the second substrate substantially overlaps an orthographic projection of the second inclined surface on the second substrate.

6. The encapsulation structure according to claim 1, comprising a plurality of first sealants and a plurality of second sealants, wherein the plurality of first sealants correspond to the plurality of second sealant in a one-to-one manner.

7. The encapsulation structure according to claim 6, wherein the plurality of first sealants are connected into a closed ring, and the plurality of second sealants are connected into a closed ring.

8. The encapsulation structure according to claim 6, comprising four first sealants and four second sealants, wherein the four first sealants correspond to the four second sealants in the one-to-one manner, the four first sealants are connected into a closed ring, and the four second sealants are connected into a closed ring.

9. The encapsulation structure according to claim 1, wherein the direction from the first position to the second position is a length direction of the first sealant and a length direction of the second sealant.

10. The encapsulation structure according to claim 1, wherein each of a material of the first sealant and a material of the second sealant comprises an ultraviolet curable resin or a heat curable resin.

11. A display panel, comprising the encapsulation structure according to claim 1, wherein the display panel comprises a display region and a peripheral region surrounding the display region, and the encapsulation structure is located in the peripheral region.

12. The display panel according to claim 11, wherein the display region is of a rectangular shape;
the encapsulation structure comprises four first sealants and four second sealants, the four first sealants correspond to the four second sealants in the one-to-one manner, the four first sealants are connected into a closed rectangular ring, and the four second sealants are connected into a closed rectangular ring.

13. An electronic device, comprising the encapsulation structure according to claim 1.

14. An encapsulation method, comprising:
providing a first substrate and a second substrate;
forming a first sealant and a second sealant between the first substrate and the second substrate, in which the first sealant comprises a first inclined surface facing away from the first substrate, and the second sealant comprises a second inclined surface facing away from the second substrate; and
bonding the first substrate and the second substrate to each other by the first sealant and the second sealant, in which the second inclined surface is attached to and in contact with the first inclined surface, wherein
in a direction parallel to the first substrate and the second substrate, each of the first inclined surface and the second inclined surface extends from a first position to a second position;
along a direction from the first position to the second position, a distance from the first inclined surface to the first substrate gradually changes, and a distance from the second inclined surface to the second substrate gradually changes; and
within a range from the first position to the second position, sums of the distance from the first inclined surface to the first substrate and the distance from the second inclined surface to the second substrate are substantially equal.

15. The encapsulation method according to claim 14, comprising:
forming the first sealant on the first substrate, and forming the second sealant on the second substrate, wherein
the first sealant is coated on the first substrate along a first direction, and the second sealant is coated on the second substrate along a second direction opposite to the first direction.

16. The encapsulation method according to claim 15, comprising:
coating the first sealant on the first substrate along the direction from the first position to the second position, wherein the distance from the first inclined surface to the first substrate gradually decreases along the direction from the first position to the second position; and
coating the second sealant on the second substrate along a direction from the second position to the first position, wherein the distance from the second inclined surface to the second substrate gradually increases along the direction from the first position to the second position.

17. The encapsulation method according to claim 15, comprising:
coating the first sealant on the first substrate along a direction from the second position to the first position, wherein the distance from the first inclined surface to the first substrate gradually increases along the direction from the first position to the second position; and
coating the second sealant on the second substrate along the direction from the first position to the second position, wherein the distance from the second inclined surface to the second substrate gradually decreases along the direction from the first position to the second position.

18. The encapsulation method according to claim 14, wherein
before bonding the first substrate and the second substrate to each other, the encapsulation method further comprises:
incompletely curing the first sealant and the second sealant so that the first sealant and the second sealant do not flow.

19. The encapsulation method according to claim 18, wherein
after bonding the first substrate and the second substrate to each other, the encapsulation method further comprises:
completely curing the first sealant and the second sealant.

20. The encapsulation method according to claim 14, wherein the direction from the first position to the second position is a length direction of the first sealant and a length direction of the second sealant.

* * * * *